United States Patent [19]

Mino et al.

[11] Patent Number: 5,391,913
[45] Date of Patent: Feb. 21, 1995

[54] SEMICONDUCTOR DEVICE

[75] Inventors: Yoshiko Mino, Settsu; Kazufumi Ogawa, Hirakata; Norihisa Mino, Settsu, all of Japan

[73] Assignee: Matsushita Electric Industrial Co., Ltd., Osaka, Japan

[21] Appl. No.: 996,568

[22] Filed: Dec. 24, 1992

[30] Foreign Application Priority Data

Dec. 27, 1991 [JP] Japan .................. 3-347178

[51] Int. Cl.⁶ ............................................. H01L 29/34
[52] U.S. Cl. ..................... 257/632; 257/432; 257/433; 257/791
[58] Field of Search .................. 257/632, 791, 40, 432, 257/440, 433, 434, 435

[56] References Cited

U.S. PATENT DOCUMENTS

| | | | |
|---|---|---|---|
| 2,913,358 | 11/1959 | Harrington et al. | 257/632 |
| 4,388,128 | 6/1983 | Ogawa et al. | 156/64 |
| 4,973,537 | 11/1990 | Tei et al. | 430/67 |
| 5,225,499 | 6/1993 | Kokaku et al. | 525/530 |

FOREIGN PATENT DOCUMENTS

| | | |
|---|---|---|
| 58-167731 | 9/1983 | Japan . |
| 59-52338 | 5/1984 | Japan . |
| 2113523 | 4/1990 | Japan . |
| 2232232 | 9/1990 | Japan . |
| 3077892 | 4/1991 | Japan . |

Primary Examiner—Sara W. Crane
Attorney, Agent, or Firm—Birch, Stewart, Kolasch & Birch

[57] ABSTRACT

In the present invention, for the purpose of precluding defective image caused by stains adhering on the surfaces of a semiconductor device and a color filter of a solid-state color image sensor, a semiconductor device excellent in the water- and oil- repellency, anti-soiling property and durability is provided, by forming on the each surface a uniform water- and oil-repellent protective film with a thickness on the order of nanometer, by treating with a nonaqueous solvent containing a chlorosilane surface treating agent having a fluoroalkyl.

18 Claims, 5 Drawing Sheets

SEMICONDUCTOR DEVICE

BACKGROUND OF THE INVENTION

The present invention relates to a semiconductor device utilized in the television industry and so forth and particularly has reference to a solid-state color image sensor having a photodiode.

At present as such a solid-State image pickup device, there is an available solid-state color image sensor of on-chip color filter type/filter-bonded type.

Heretofore, in the semiconductor device formed on a silicon substrate, for proofing against moisture which causes corrosion of metal, generally the surface of the device is protected with an $SiO_2$ film and further hermetically sealed by packaging.

If there exist any stains on the $SiO_2$ film, various troubles take place. For example, in the case of a solid-state color image sensor, if any stains exist on the surface of the image area region, the stains manifest themselves as shadows on the image, and raise a problem of defective image. The semiconductor device covered with an insulating film such as the $SiO_2$ film left in as-formed state, tend to be charged with electricity, so that the stains, such as dust and the like, tend to stick on the surface of the device. It is particularly liable to be charged in the assembling step of putting the semiconductor device into a package.

In this connection, applying an antistatic agent or forming a transparent resin layer containing an antistatic agent on the top surface of the semiconductor device has been proposed. According to this proposal (Japanese Patent Application No. Sho 59-92338 (KOKAI No. Sho 60-58681) the top-most surface of the semiconductor device or the on-chip color filter type semiconductor device is subjected to this treatment.

Besides, the color filter is made of an organic material. There is a possibility of microbes generating and propagating in the organic material. Soiled front and back surfaces of the sealing glass plate also cause the generation and propagation of microbes. For averting such occurrences, uniform coating of the top surface of the color filter or the sealing glass surfaces using a transparent resin containing an antimold agent, is proposed (Japanese Patent Application No. Sho 58-167731 (KOKAI No. Sho 60-58681).

However, such a film is a protective film formed by casting or spin coating. In this way, it is difficult to form the film having a thickness of the order of nanometer. Moreover, there is a problem that the protective film, formed as a thin film, tends to be removed off the surface.

SUMMARY OF THE INVENTION

The object of the present invention is to provide a semiconductor device provided with a protective film excellent in water- and oil-repellency, durability and anti-soiling property by forming a very thin uniform film with such a small thickness as measured on the nanometer order on the surface of a semiconductor device or a color filter and a manufacturing method thereof.

For the purpose of the present invention, a chemically bonded monomolecular film having siloxane bonds is formed on the surface of a semi-conductor device or a color filter of a solid-state color image sensor.

In the present invention, since a chemically bonded monomolecular film having siloxane bonds is formed on the surface of a semiconductor device or a color filter of a solid-state color image sensor, a protective film excellent in the water- and oil-repellency, durability and anti-soiling property is obtainable. Because this film is a monomolecular film of such a very small thickness as to be measured on the nanometer or angstrom unit, it provides a protective film excellent in transparency and does not impair the function which the solid-state color image sensor is endowed with.

Figure 1:
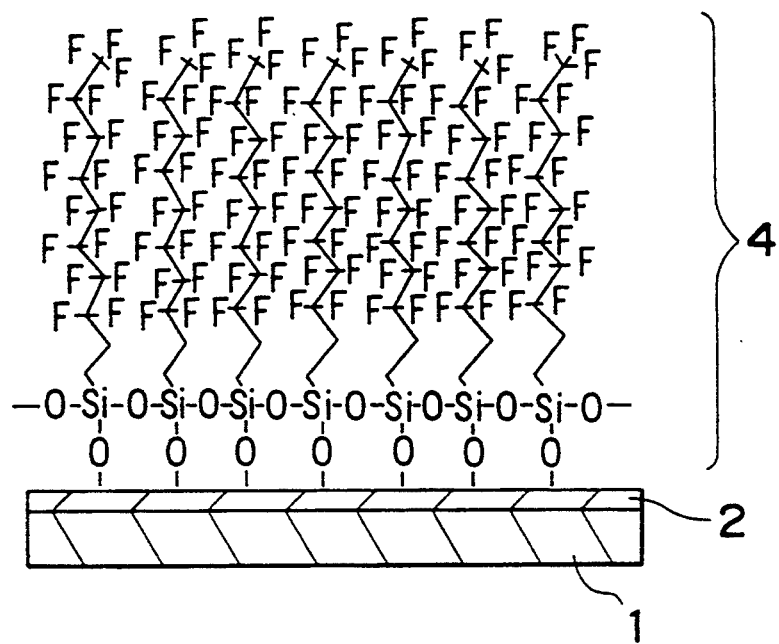
FIG. 1 is a schematic view in section of the surface of the semiconductor device of the present invention, representing the process of the Example 1.

1. Semiconductor device
2. Oxide film
3. Hydroxyl group
4. Monomolecular film
5. Transparent plate
6. Color-filter
7. Adhesive agent
8. Adhesive Regions
9. Liquid globule
10. Injection needle
11. Silicone substrate
12. CCD camera

DETAILED DESCRIPTION OF THE INVENTION

In the preferred embodiment of the present invention, the chemically bonded film is formed on the surface by reaction between a chlorosilane surface treating agent and a hydroxyl group existing on the surface.

When the surface is protected by an $SiO_2$ film, there exist a large number of hydroxyl groups. However, in case when the surface of a resin, as in a on-chip color filter type solid-state image pickup device, there exist only a very small number of hydroxyl groups, the surface may be made to be hydrophilic by subjecting it to plasma treatment, ultraviolet ray irradiation, or siloxane layer formation.

In the present invention, said hydrophilic surface is brought in contact with a nonaqueous solvent containing a chlorosilane surface treating agent having a straight carbon chain, for example, a fluoroalkyl or an alkyl, to react the chlorosilyl group ($SiCl_nX_{3-n}$, wherein n is 1, 2, or 3, and X is a functional group) of the agent with the hydroxyl groups on the surface, thereby enabling a monomolecular film consisting of said agent to be deposited on the surface.

In the another procedure, a surface is contacted with an nonaqueous solvent containing a chlorosilane derivative having more than two chloride atoms bonded directly to the silicon atom, to react the derivative with the hydroxyl group on the surface. Then, the surface is washed with a nonaqueous organic solvent to remove the excess derivative remaining on the surface. Thereby the surface is provided with a silanol film having a large number of hydroxyl groups.

Thereafter, a chlorosilane surface treating agent having a nonbranched fluoroalkyl or alkyl is bonded to the hydroxyl groups of the silanol film, thereby a chemically bonded monomolecular film of the fluoroalkyl or alkyl is formed on the surface.

According to the present invention, it is possible to form a monomolecular film of a fluoroalkyl or alkyl with such a very small thickness as on the nanometer level on the surface of, for instance a semiconductor device, a color filter, a transparent plate and the like. The surface of the obtained film is less susceptible to injury and excellent in the durability, water- and oil-repellency and anti-soiling property.

In the present invention, examples of chlorosilane surface treating agents having a fluoroalkyl, are not only trichlorosilane surface treating agents such as:
$CF_3(CF_2)_7(CH_2)_2SiCl_3$, $CF_3CH_2O(CH_2)_{15}SiCl_3$, $CF_3(CH_2)_2Si(CH_3)_2(CH_2)_{15}SiCl_3$,
$F(CF_2)_4(CH_2)_2Si(CH_3)_2(CH_2)_9SiCil_3$,
$F(CF_2)_8(CH_2)_2Si(CH_3)_2(CH_2)_9SiCl_3$, $CF_3COO(CH_2)_{15}SiCl_3$ and $CF_3(CF_2)_5(CH_2)_2SiCl_3$, but also monochlorosilane or dichlorosilane surface treating agents having lower alkyds such as:
$CF_3(CF_2)_7(CH_2)_2SiCl_n(CH_3)_{3-n}$,
$CF_3(CF_2)_7(CH_2)_2SiCl_n(C_2H_2)_{3-n}$, $CF_3CH_2O(CH_2)_{15}SiCl_n(CH_3)_{3-n}$, $CF_3CH_2O(CH_2)_{15}SiCl_n(C_2H_5)_{3-n}$,
$CF_3(CH_2)_2Si(CH_3)_2(CH_2)_9SiCl_n(CH_3)_{3-n}$,
$F(CF_2)_4(CH_2)_2Si(CH_3)_2(CH_2)SiCl_n(C_{2H5})_{3-n}$,
$F(CF_2)_8(CH_2)_2Si(CH_3)_2(CH_2)_9SiCl_n(CH_3)_{3-n}$,
$CF_3COO(CH_2)_{15}SiCl_n(CH_3)_{3-n}$, and
$CF_3(CF_2)_5(CH_2)_2SiCl_n(CH_3)_{3-n}$ (wherein n is either 1 or 2 each).

Among them, trichlorosilane surface treating agent is most preferable, since the chlorine-silicon bonding other than reacted with the hydroxyl group of the surface, react with neighboring chlorine-silicon bonding to provide siloxane bonding, thereby the chemically bonded film becomes stronger.

Among the trichlorosilane derivatives, $CF_3(CF_2)_nCH_2CH_2SiCl_3$ (wherein n is an integer, about 3-25, which are most readily handlable) are desirable, because their water- and oil-repellency and anti-soiling property, and functional property are well balanced. Further, if ethylene or acetylene are added to or incorporated into the alkyl chain, such molecules may be bridged by irradiation of electron beams on the order of 5 megarads, after forming the monomolecular film. In this way it is possible to further improve the hardness of the monomolecular film of the present invention.

The fluoroalkyl or the alkyl of the chlorosilane surface treating agents usable according to this invention may be in nonbranched form as hereabove-mentioned as well as in branched form. Further, the chlorosilane surface treating agent of the present invention may have more than two fluoroalkyl or alkyl substituents (i.e., those represented by general formulae, $R_2SiCl_2$, $R_3SiCl$, $R_1R_2SiCl_2$ or $R_1R_2R_3SiCl$, etc., wherein, R, $R_1$, $R_2$ and $R_3$ represent a fluoroalkyl or an alkyl). In general, for enhancement of adsorption density, the nonbranched form is preferred.

In one of the preferred embodiments of the present invention, particularly in case of the surface of a resin, it is preferred to form a silanol film on the surface before cumulating said monomolecular film, in order to make the surface hydrophilic. For the formation of silanol film, it is preferred to use chlorosilane derivatives having at least two chlorine atoms bonded directly to the silicone atom, such as $SiCl_4$, $SiHCl_3$, $SiH_2Cl_2$, Cl—($SiCl_2O)_n$—$SiCl_3$ (wherein n represents an integer), $SiCl_m(CH_3)_{4-m}$, $SiCl_m(C_2H_5)_{4-m}$ (wherein m represents an integer of 2 or 3) and $HSiCl_2CH_3$, $HSiCl_2C_2H_5$, since after chemically bonded on the surface, the chlorosilane derivative is converted into silanol by water, and thereby making the surface hydrophilic. Among such chlorosilane derivatives, tetrachlorosilane ($SiCl_4$), which has high reactivity and a small molecular weight and is therefore able to provide hydroxyl groups on the surface at high density, is most preferable. Thus in this way the hydrophilic property of the surface can be more enhanced than that by the oxidation treatment. On the top of this, for example, any chlorosilane surface treating agent containing a fluoroalkyl may be chemically bonded. Such a chemically bonded film formed in this way has a higher density.

As the nonaqueous solvents used according to this invention, any organic solvents that have no active hydrogen which is reactive with the chlorosilane base surface treating agent will do. Examples include:
Either fluorocarbons such as;
1,1-dichloro-1-fluoroethane, 1,1-dichloro-2,2,2-trifluoroethane, 1,1-dichloro-2,2,3,3,3-pentafluoropropane, 1,3-dichloro-1,1,2,2,3-heptafluoropropane, etc.;
hydrocarbons suchas hexane, octane, hexadecane and cyclohexane; ethers such as dibutyl and dibenzyl ethers; or esters such as methyl, ethyl, isopropyl and amyl acetates.

Figure 3:
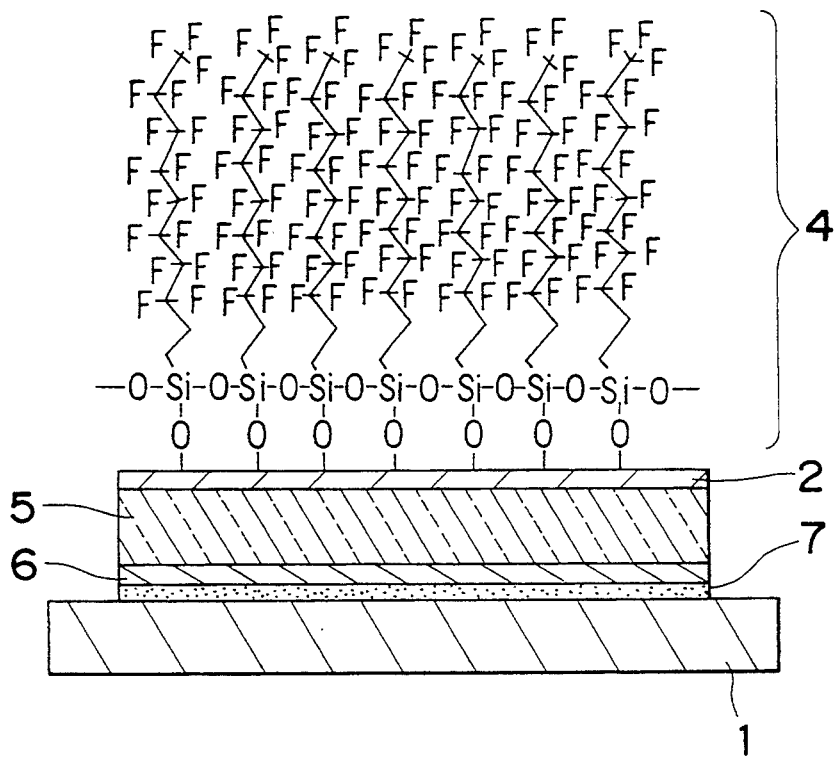
FIG. 3 is a schematic view in section of a solid-state color image sensor in which a semiconductor device, a color filter and a transparent plate are closely adhered, representing the process of the Example 2.
Figure 4:
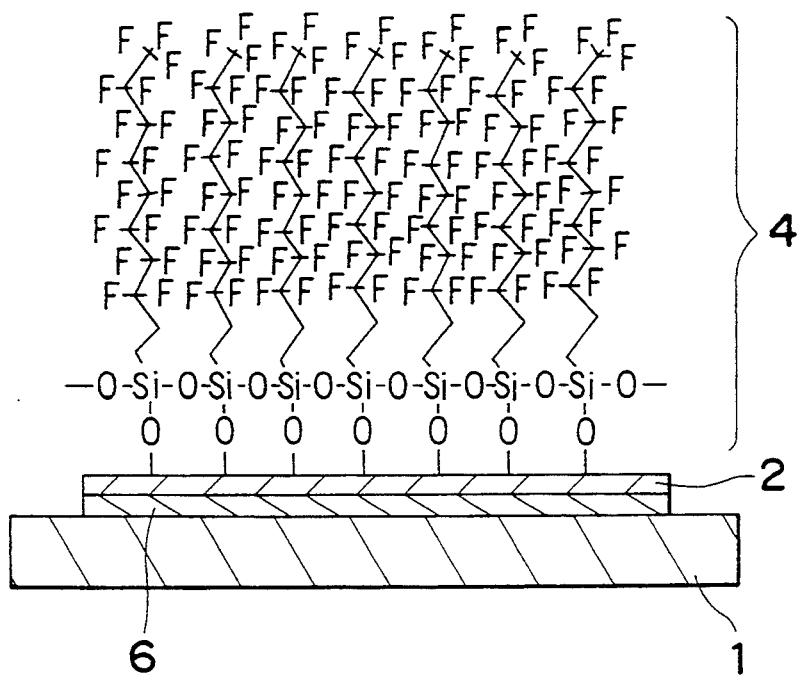
FIG. 4 is a schematic view in section of a solid-state color image sensor in which a semiconductor device and a color filter are closely adhered, representing the process of the Example 3.
Figure 5:
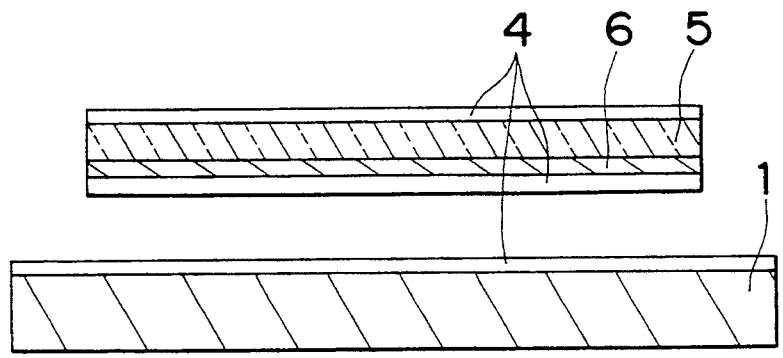
FIG. 5 is a schematic exploded view in section of a solid-state color image sensor having a semiconductor device and a color filter with a transparent plate, representing the process of the Example 4 and showing the state of the monomolecular protective films being formed.
Figure 7:
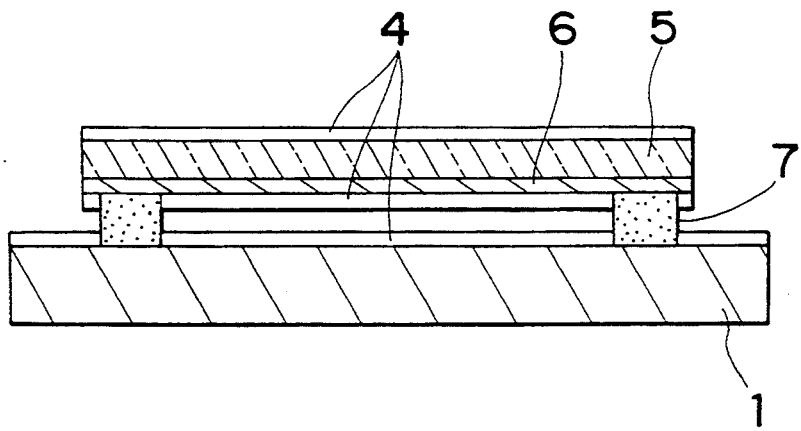
FIG. 7 is a schematic view in section of a solid-state color image sensor of the present invention, representing the process of the Example 4 and showing the state of the semiconductor device and the color filter being stuck together.

The water- and oil-repellent monomolecular filter 4 of the present invention may be formed directly on a surface of a semiconductor chip as shown in FIG. 1, or in the case of a solid-state color image sensor comprising at least a color filter 6 formed on a transparent plate 5 stuck together with its semiconductor device 1, as shown in FIG. 3, it may be formed on the transparent plate 5. In general, the transparent plate 5 is made of glass or the like. Further, in the case of an on-chip color filter type solid-state color image sensor comprising a color filter 6 formed directly on its semiconductor device 1, as shown in FIG. 4, the water- and oil-repellent film 4 may be formed directly on the color filter 6. Furthermore, as shown in FIG. 5, the water- and oil-repellent film 4 may be formed on both surfaces of a color filter 6 formed on a transparent plate 5 and of a semiconductor device 1 individually. Then, as shown in FIG. 7, the filter 6 and the substrate 1 may be stuck together with a space through an adhesive agent 7 which also functions as a spacer. In this way, a solid-state color image sensor comprising a color filter 6 and a semiconductor device 1 having water- and oil-repellent films on their facing surfaces is provided.

All of the above mentioned embodiments are also included in the present invention.

EXAMPLE 1

Figure 2:
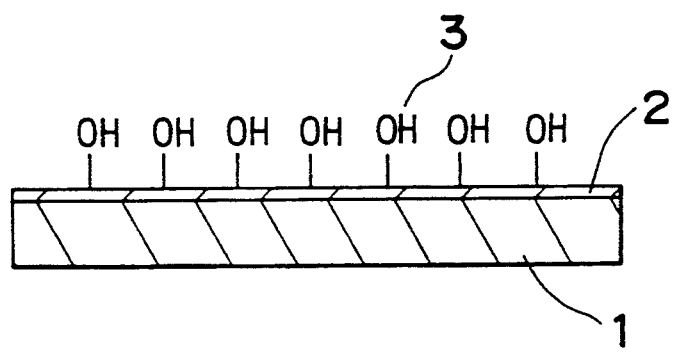
FIG. 2 is a schematic view in section of the surface of the semiconductor device of the present invention before the treatment of the Example 1.

First, a semiconductor device 1 washed with an organic solvent was immersed for about 2 hr in a nonaqueous solvent containing a chlorosilane surface treating agent having a fluoroalkyl, for example, a solution prepared from about 2% by weight of $CF_3(CF_2)_7(CH_2)_2SiCl_3$, 80% by weight of n-hexadecane (toluene, xylene or dicyclohexane was usable), 12% by weight of carbon tetrachloride and 8% by weight of chloroform. Since a oxide film 2 was formed on the surface of the semiconductor device 1 and the surface of this oxide film 2 contains a large number of hydroxyl groups 3 (refer to FIG. 2), the chlorosilane surface treating agent was reacted with the hydroxyl groups and chemically bounded to the surface in a formula such as shown in [Chem 1] through dehydrochloration. Then a protective film with an about 15 angstrom thickness was formed as a fluoroalkyl monomolecular film 4 being chemically bonded to overall surface of the semiconductor device 1, as shown in FIG. 1.

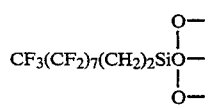

[Chem 1]

EXAMPLE 2

First, a solid-state color image sensor having a color filter 6 formed on a transparent plate 5 made of glass stuck together with a solid-state image sensor through an adhesive agent 7 was washed with an organic solvent. Thereafter, similarly as in Example 1, the solid-state color image sensor was immersed for about 2 hr in a nonaqueous solvent containing a chlorosilane surface treating agent having a fluoroalkyl, for example, a solution prepared from about 2% by weight of $CF_3(CF_2)_7(CH_2)_2SiCl_3$, 80% by weight of n-hexadecane (toluene, xylene or dicyclohexane was usable), 12% by weight of carbon tetrachloride and 8% by weight of chloroform. Since an oxide film 2 was formed on the surface of the transparent plate 5 and the semiconductor device 1 of the solid-state color image sensor, and the surface of this oxide film contains a large number of hydroxyl groups 3, the chlorosilane surface treating agent was reacted with the hydroxyl group and chemically bounded to the surface in a formula such as shown in [Chem 1] through dehydrochloration. Then a protective film with an about 15 angstrom thickness was formed as a fluoroalkyl monomolecular film 4 being chemically bonded to the overall surface of the transparent plate 5, as shown in FIG. 3. A state wherein a water- and oil-repellent protective film was formed on the image area with the color filter was only illustrated in FIG. 3 in the aspect of the purpose of the present invention preventing a solic-state color image sensor from image defect.

EXAMPLE 3

First, a on-chip color filter type solid-state color image sensor having a color filter 6 made of an organic material directly formed on a semiconductor device 1 was subjected to plasma treatment, ultraviolet ray irradiation or so forth, to make the surface of the organic filter to be hydrophilic. Thereafter, similarly as in Example 1, the color solid-state image pickup device was immersed for about 2 hr in a nonaqueous solvent containing a chlorosilane surface treating agent having a fluoroalkyl, for example, a solution prepared from about 2% by weight of $CF_3(CF_2)_7(CH_2)_2SiCl_3$, 80% by weight of n-hexadecane (toluene, xylene or dicyclohexane was usable), 12% by weight of carbon tetrachloride and 8% by weight of chloroform. Since an oxide film 2 was formed on the surface of the color filter 6 and the semiconductor device 1 of the solid-state color image sensor, and the surface of this oxidized film contains a large number of hydroxyl groups 3, the chlorosilane surface treating agent was reacted with the hydroxyl group and chemically bonded to the surface in a formula such as shown in [Chem 1] through dehydrochloration. Then a protective film with an about 15 angstrom thickness was formed as a fluoroalkyl monomolecular film 4 being chemically bonded to the overall surface of the color filter 6, as shown in FIG. 4. A state wherein a water- and oil-repellent protective film was formed on the image area with the color filter was only illustrated in FIG. 4 in the aspect of the purpose of the present invention preventing a solid-state color image sensor from image defect.

EXAMPLE 4

First, as shown in FIG. 5, a color filter 6 formed on a transparent plate 5 and a semiconductor device 1 on which a solid-state image pickup device was formed, were individually treated similarly as in Example 1, thereby provided a chemically bonded monomolecular protective film 4 on the overall each surface.

Figure 6:
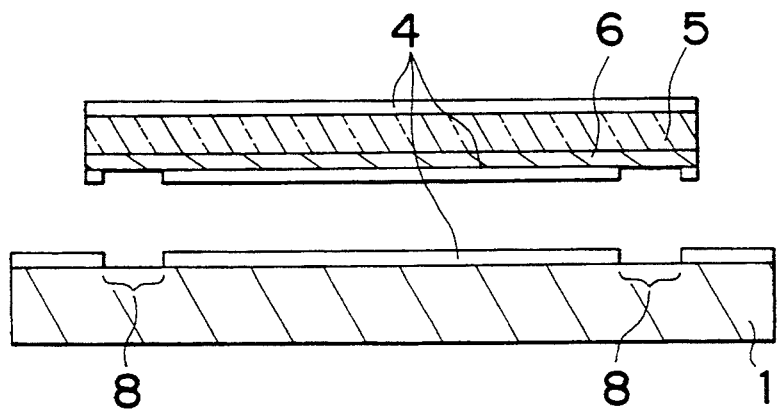
FIG. 6 is a schematic exploded view in section of a solid-state color image sensor, representing the process of the Example 4 and showing the state of the adhesive regions being etched.

Next, as shown in FIG. 6, the adhesive regions 8 of both the color filter 6 and the semiconductor device 1 are respectively subjected to dry etching, thereby to partially remove the chemically bonded monomolecular protective film 4 from the regions.

Finally, as shown in FIG. 7, adhesive agent 7 was applied to the removed regions, to stick together the color filter 6 and the solid-state image pickup device, providing a solid-state color image sensor.

EXAMPLE 5

In this example, the water-repellency of the silicone substrate with or without the chemically bonded film of the present invention was estimated by measuring the contact angle.

Figure 8:
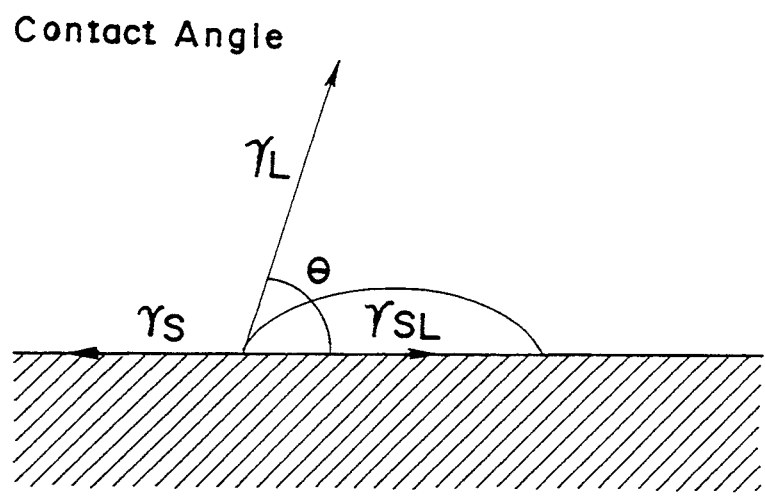
FIG. 8 is a schematic view showing the contact angle between a solid and a liquid.

The water-repellency of a solid is generally estimated by measuring a contact angle between a liquid and the surface of the solid. FIG. 8 shows the state of wetting when a liquid globule is putted on a solid. The relationship between the wetting and the contact angle is indicated as follows:

$$A = \gamma s - \gamma s L^{\cos\theta}$$

(wherein A: wettability (mN/m), γs: surface tension of the solid, γsL: interfacial tension between the solid and the liquid, θ: contact angle). Therefore, the contact angle θ is smaller, the A becomes greater, which indicates high wettability. The contact angle θ is greater, the A becomes smaller, which indicates less wettability, i.e. high water-repellency.

Figure 9:
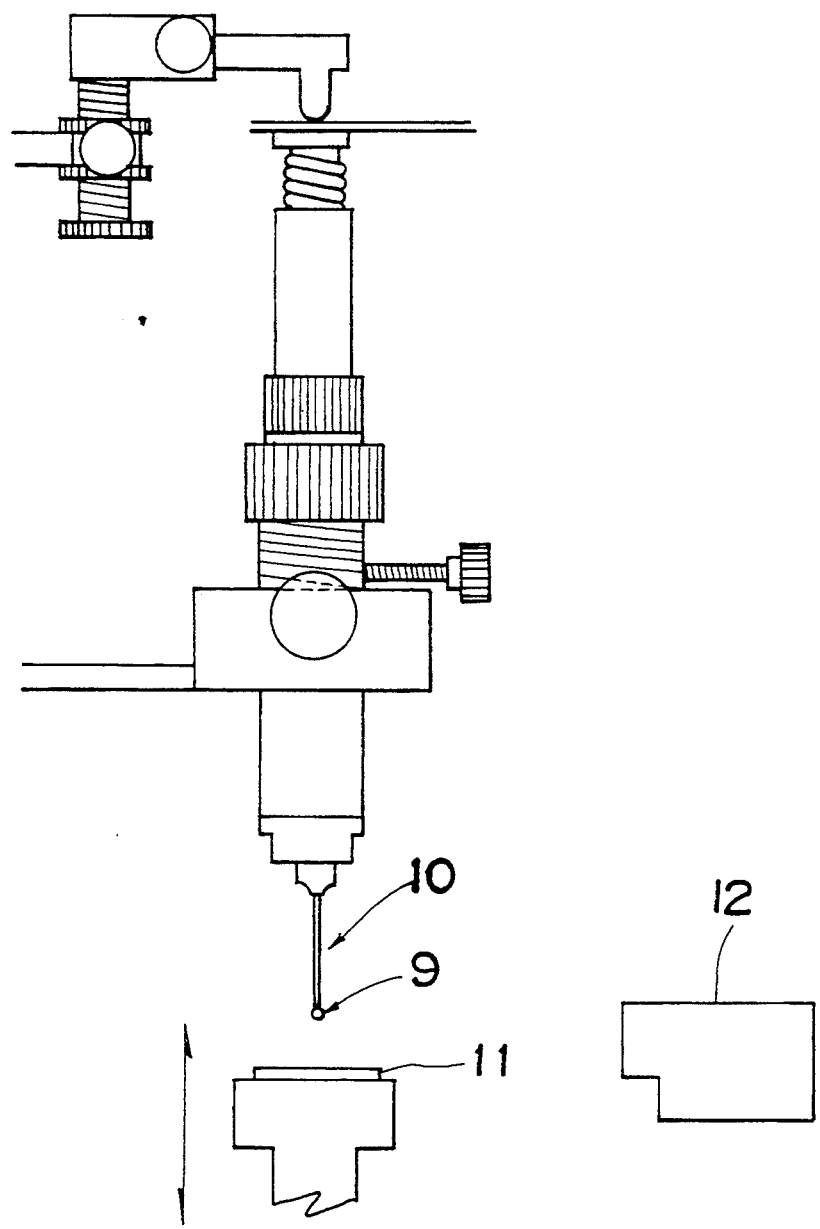
FIG. 9 is a schematic view showing a device for measurement of the contact angle.

The contact angle was measured with an automatic contact angle measurement device (CA-Z type: produced by KYOWA KAIMENKAGAKU Co., Ltd.) shown in FIG. 9. The test was taken place in a clean-room where the temperature, moisture and dust are controlled. The liquid used in the measurement was pure water.

The liquid globule 9 produced at the injection needle point 10 of the device was put on the clean surfaces of both of the silicone substrate 11 without and with the chemically bonded filter of the present invention, by contacting said needle on the surfaces. A photograph of the globule 1 on the surface of the substrate 11 was taken by a CCD camera 12 through microscope. Then, the photograph was subjected to image analysis by a computer, and the contact angles were measured automatically.

The result was that the liquid globule on the surface of the substrate without the filter of the present invention was wildly spread on the surface over the visual field of the monitor. The shape of the edge of the globule was instable, and the measurement was uneven, but the average contact angle was about 5°. While, the contact angle of the liquid globule on the surface of the substrate with the monomolecular film of the present invention was about 100°.

EXAMPLE 6

An oil-repellency was determined according to a similar manner to the Example 5, using a mixture of water and ethylene glycol monoethyl ether instead of water. The results was shown below:

| content of ethylene glycol monoethyl ether (wt. %) | contact angle |
|---|---|
| 97.0% | 63.0° |
| 14.4% | 84.3° |

What is claimed is:

1. A solid-state color image sensor, comprising a semiconductor device closely adhered to a color filter and a water- and oil-repellent chemically bonded monomolecular film which has one layer of polysiloxane bonds.

2. A protected semiconductor device improved in water- and oil-repellency, comprisings a water- and oil-repellent monomolecular film chemically bonded to a surface of semiconductor device, wherein said monomolecular film has one layer of polysiloxane bonds.

3. The solid-state color image sensor of claim 1, wherein said monomolecular film is chemically bonded to the surface of the semiconductor device with siloxane bonds.

4. The solid-state color image sensor of claim 1, wherein said monomolecular film contains fluoroalkyl or alkyl groups.

5. The protected semiconductor device of claim 2, wherein said monomolecular film contains fluoroalkyl or alkyl groups.

6. The protected semiconductor device of claim 2, wherein said monomolecular film is chemically bonded with siloxane bonds.

7. The solid-state color image sensor of claim 1, where said monomolecular film has a thickness of about fifteen angstroms.

8. The protected semiconductor device of claim 2, wherein said monomolecular film has a thickness of about fifteen angstroms.

9. The solid-state color image sensor of claim 1, wherein said monomolecular film contains a fluoroalkyl group.

10. The protected semiconductor device of claim 2, wherein said monomolecular film contains a fluoroalkyl group.

11. The solid-state color image sensor of claim 1, wherein said monomolecular film contains fluoroalkyl groups which are oriented away from the surface of said color image sensor.

12. The protected semiconductor device of claim 2, wherein said monomolecular film contains fluoroalkyl groups which are oriented away from the surface of said semiconductor device.

13. The solid-state color image sensor of claim 1, further comprising a transparent plate closely adhered to said color filter which is closely adhered to said semiconductor device, wherein said monomolecular film is chemically bonded to an outer surface of said transparent plate.

14. The solid-state color image sensor of claim 13, wherein said monomolecular film contains a fluoroalkyl or alkyl group.

15. The solid-state color image sensor of claim 13, wherein said monomolecular film is chemically bonded to an outer surface of said transparent plate with siloxane bonds.

16. The solid-state color image sensor of claim 13, wherein said semiconductor device color filter and said transparent plate are arranged such that a first side of said color filter is closely adhered to said transparent plate and a second side of said color filter is closely adhered to said semiconductor device, such that a space exists between said color filter and said semiconductor device, and wherein said monomolecular film is chemically bonded to each surface of said transparent plate, said color filter and said semiconductor device.

17. The solid-state color image sensor of claim 16, wherein said monomolecular film contains a fluoroalkyl or alkyl group.

18. The solid-state color image sensor of claim 16, wherein said monomolecular film is chemically bonded to said transparent plate with siloxane bonds.

* * * * *